United States Patent
Main et al.

(10) Patent No.: US 6,834,086 B2
(45) Date of Patent: Dec. 21, 2004

(54) DEMODULATOR AND METHOD FOR SECOND HARMONIC CANCELLATION

(75) Inventors: William Eric Main, Mesa, AZ (US); Danielle L. Coffing, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 708 days.

(21) Appl. No.: 09/746,278

(22) Filed: Dec. 21, 2000

(65) Prior Publication Data

US 2002/0080892 A1 Jun. 27, 2002

(51) Int. Cl.[7] .......................... H04L 27/22; H04L 27/16
(52) U.S. Cl. ........................................ 375/316; 375/326
(58) Field of Search ................................. 375/316, 344

(56) References Cited

U.S. PATENT DOCUMENTS

| | | | | |
|---|---|---|---|---|
| 4,198,604 A | * | 4/1980 | Holdaway | 455/260 |
| 4,347,483 A | * | 8/1982 | Flasza et al. | 331/12 |
| 4,462,109 A | * | 7/1984 | Hughes | 375/344 |
| 4,531,098 A | * | 7/1985 | Reed | 330/53 |
| 4,709,408 A | * | 11/1987 | Itakura et al. | 455/260 |
| 5,457,424 A | * | 10/1995 | McGinn et al. | 329/306 |
| 5,621,416 A | * | 4/1997 | Lennen | 342/357.12 |
| 6,069,524 A | * | 5/2000 | Mycynek et al. | 329/308 |
| 6,396,550 B1 | * | 5/2002 | Oh | 348/735 |
| 6,748,029 B1 | * | 6/2004 | Lee | 375/326 |

* cited by examiner

*Primary Examiner*—Stephen Chin
*Assistant Examiner*—Lawrence Williams

(57) ABSTRACT

A demodulator circuit (10) having harmonic cancelling receives an input signal (IF) and generates an oscillator signal (OSC) in an oscillator circuit (14). The oscillator signal (OSC) is locked to the same frequency and phase as the input signal (IF). A phase shift circuit (18) generates a shifted signal (OSC SHIFTED) that is in quadrature with the oscillator signal (OSC). A multiplier (22) receives the oscillator signal (OSC) and the shifted signal (OSC SHIFTED) and generates an output signal (2IF) having twice the frequency of the oscillator signal (OSC). A multiplier circuit (24) also receives the input signal (IF) and along with the oscillator signal (OSC) generates an output signal (PD). The signals generated by the multiplier (22) and the multiplier circuit (24) are summed in a summing circuit (30) that supplies an output signal (OUT).

12 Claims, 1 Drawing Sheet

DEMODULATOR AND METHOD FOR SECOND HARMONIC CANCELLATION

This invention is related, in general, to signal conversion and, more specifically, to signal conversion using a demodulator circuit.

Portable communication products require circuits that can perform well in a low power environment. A reduction of power supply voltages allows for fewer battery cells, reducing the size and weight of the portable equipment. However, the lower power constraint adversely affects the performance of standard RF circuitry. Circuits are needed that can achieve the design goals for noise figure, linearity and power consumption for portable communications products.

In a two-way communication link, the receiver in the portable communication products includes low-noise amplifiers and mixers. The receiver down-converts the received signal in frequency from the Radio Frequency (RF) range to the Intermediate Frequency (IF) range. The output signal generated by the mixer has a frequency that is the difference between the frequency of the received RF signal and the frequency of a local oscillator signal, thus converting the received RF signal to an IF signal.

A demodulator receives the IF signal, demodulates it to baseband and filters the baseband signal. Demodulation usually involves passing the signal through a frequency-dependant phase shift circuit, then comparing the output signal with the original signal in a phase detector or multiplier. The nominal phase shift is 90 degrees, so the nominal output signal from the phase detector is a square wave at twice the input frequency and commonly referred to as the harmonic. Deviations in input frequency produce deviations from phase quadrature which show up as changes in the mark-to-space ratio of the output signal which can be filtered to provide the baseband signal.

However, filtering the unwanted harmonic signal can be difficult under conditions where the amplitude of the unwanted signal is greater than the amplitude of the wanted signal. Accordingly, a need exists for a demodulator in a receiver circuit that generates an output signal having the modulation information while cancelling the unwanted harmonic information.

DETAILED DESCRIPTION OF THE DRAWINGS

Figure 1:
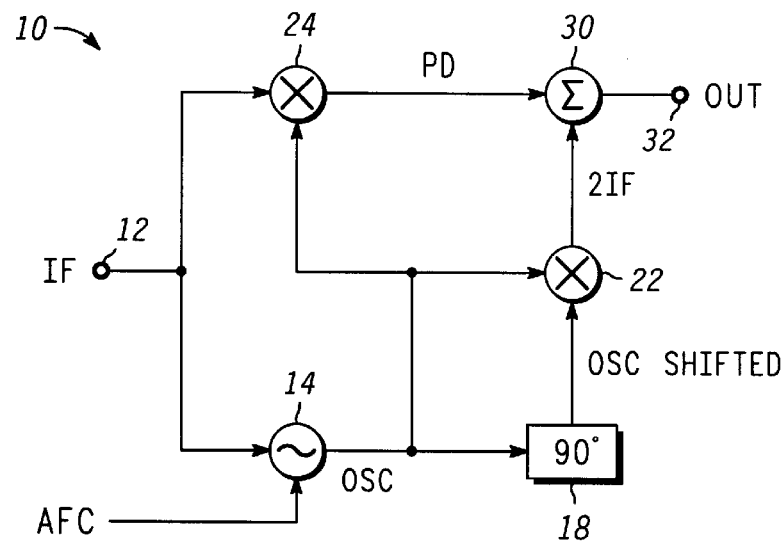
FIG. 1 is a block diagram of an integrated injection-locked demodulator circuit that cancels the twice-IF signal while retaining the modulation information.

FIG. 1 is a block diagram of an integrated injection-locked demodulator circuit 10 having harmonic cancelling. Demodulator circuit 10 can be used for personal communications service or in a cellular phone, among other uses. Demodulator circuit 10 receives a differential signal IF at input terminal 12 and generates a signal OUT at terminal 32 that cancels the twice-IF signal while retaining the modulation information of the IF signal. Demodulator circuit 10 includes an oscillator circuit 14 having an input connected to terminal 12 for receiving the signal IF and an output for supplying the signal OSC. Oscillator circuit 14 has another input for receiving an Automatic Frequency Control (AFC) signal.

A phase shift circuit 18 has an input connected to the output of oscillator circuit 14 for receiving the signal OSC. Phase shift circuit 18 generates an output signal OSC SHIFTED that is phase shifted by 90° from the signal OSC. Demodulator circuit 10 further includes a multiplier 22 having inputs connected for receiving the signals OSC and OSC SHIFTED. Multiplier 22 generates a signal 2IF that has a frequency that is two times the frequency of the signal OSC. A multiplier circuit 24 receives the signals IF and OSC and generates an output signal PD. A summing circuit 30 receives the signals PD and 2IF and provides a summed output signal OUT at terminal 32.

Figure 2:
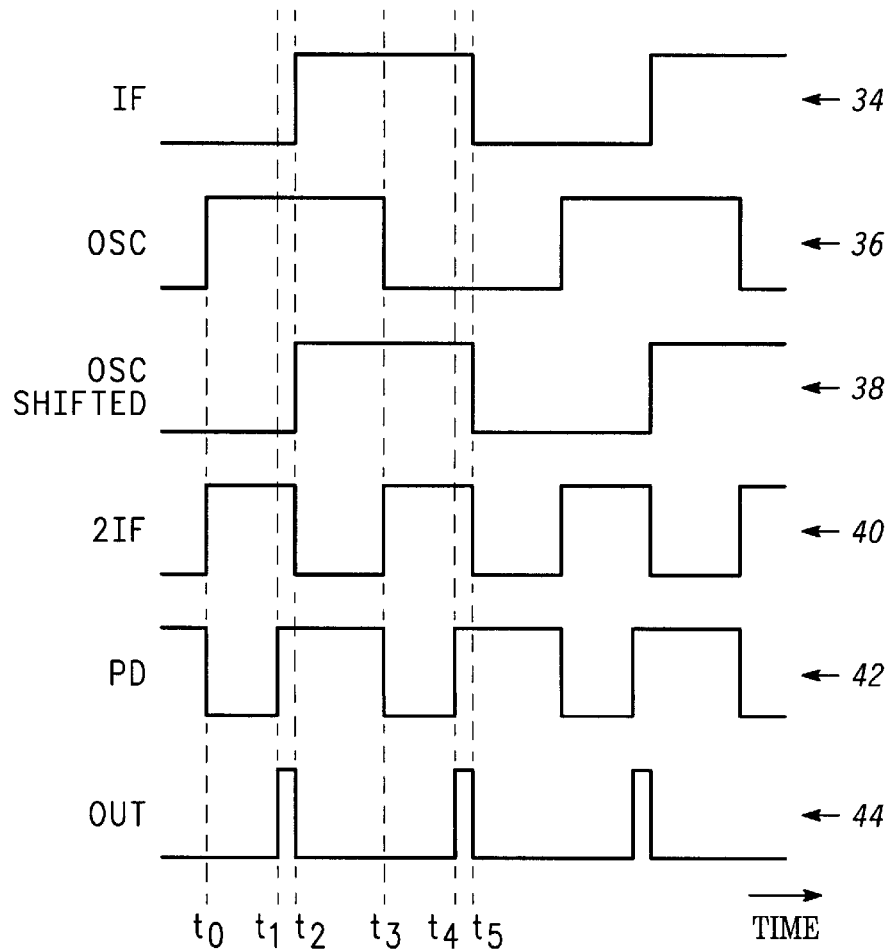
FIG. 2 is a plot of waveforms for the demodulator circuit of FIG. 1.

FIG. 2 is a plot of the signal IF and the waveforms generated by the circuits shown in demodulator circuit 10 of FIG. 1. In FIG. 2 the horizontal axis represents time and the vertical axis represents signal amplitude. Referring to FIGS. 1 and 2, waveform 34 illustrates the signal IF received by demodulator circuit 10 at input terminal 12. Waveform 36 corresponds to the signal OSC generated by oscillator circuit 14 in response to receiving the signal IF. Waveform 38 corresponds to the signal OSC SHIFTED generated by phase shift circuit 18 in response to receiving the signal OSC. Waveform 40 corresponds to the signal 2IF generated by multiplier 22 in response to receiving the signals OSC and OSC SHIFTED. The lines labeled $t_0$, $t_2$, $t_3$, and $t_5$ in FIG. 2 show several of the times at which transitions of the signal 2IF occur. Waveform 42 corresponds to the signal PD generated by multiplier circuit 24 in response to receiving the signal IF. The lines labeled $t_1$ and $t_4$ show several of the times at which transitions of the signal PD occur. Waveform 44 corresponds to the signal OUT generated by summing circuit 30 in response to receiving the signals PD and 2IF.

In operation, demodulator circuit 10 receives the baseband signal IF (waveform 34 in FIG. 2). Oscillator circuit 14 is frequency locked to the signal IF to generate the signal OSC (waveform 36 in FIG. 2) and phase shift circuit 18 uses the signal OSC to generate the quadrature signal OSC SHIFTED (waveform 38 in FIG. 2). When the free-running frequency of oscillator circuit 14 is tuned to the frequency of the signal IF, the signal OSC has a quadrature relationship with respect to the signal IF. In other words, the phase of the signal OSC is shifted by 90° with respect to the phase of the signal IF. The filtered output of the demodulator with an unmodulated input IF signal will then be zero. Tuning may be done with an Automatic Frequency Control (AFC) circuit.

Phase shift circuit 18 generates the output signal OSC SHIFTED that is phase shifted from the signal OSC by 90°. Multiplier 22 receives the signals OSC and OSC SHIFTED and generates the signal 2IF (waveform 40 in FIG. 2) having a frequency twice that of the signal OSC. Multiplier circuit 24 receives the signals IF and OSC and generates an output signal PD (waveform 42 in FIG. 2). A summing circuit 30 receives the signals PD and 2IF and provides a summed output signal OUT2 (waveform 44 in FIG. 2) at terminal 32.

Referring to FIG. 2, at time $t_0$ the signal PD transitions from a high value to a low value and the signal 2IF transitions from a low value to a high value. The signal OUT remains at a low value when the signals 2IF and PD transition at the same time. At time $t_1$ the signal PD transitions from a low value to a high value. At a latter time, i.e., time $t_2$, the signal 2IF transitions from a high value to a low value. When the signals 2IF and PD transition at different times, the signal OUT from summing circuit 30 transitions from a low value to a high value and remains at that high value until the lagging signal transitions. At time $t_3$ the signal PD transitions from a high value to a low value and the signal 2IF transitions from a low value to a high value. Again, since both of the signals 2IF and PD transition at the same time, the signal OUT remains at a low value. On the other hand, the signal OUT transitions from a low value to a high value at time $t_4$ and remains at that high value until time $t_5$ because the signal PD makes a transition at time $t_4$ and the signal 2IF makes a transition at time $t_5$.

In operation, demodulator circuit 10 receives the signal IF and uses it to lock the signal OSC in oscillator 14 to the same frequency as the signal IF. Phase shift circuit 18 generates the signal OSC SHIFTED that is in quadrature with the signal OSC. Both of the signals OSC and OSC SHIFTED are multiplied in multiplier 22 and the output signal 2IF has twice the frequency of the signal OSC. It should be noted that the signal 2IF has a fifty percent duty cycle, i.e., a mark/space ratio of one. It should be noted that the signal 2IF is a square wave having the same amplitude as the signal IF, but a frequency that is two times the frequency of the received signal IF. Multiplier circuit 24 also receives the signal IF and along with the signal OSC generates an output signal PD that indicates when the signal IF is in-phase with the signal OSC. The signal 2IF is in antiphase with the signal PD. By summing the signals PD and 2IF in summing circuit 30, the signal OUT provided at terminal 32 has a non-zero value when the received signal IF deviates in phase quadrature from the signal OSC. The signal OUT has a zero value when the signals IF and OSC are in phase quadrature.

By now it should be appreciated that a demodulator tuning circuit has been shown for use in a receiver circuit that generates an output signal having the modulation information while cancelling the unwanted second harmonic information.

What is claimed is:

1. A demodulator circuit; comprising:
   an oscillator having a first input coupled for receiving a signal;
   a phase shift circuit having an input coupled to an output of the oscillator;
   a first multiplier having a first input coupled for receiving the signal and a second input coupled to the output of the oscillator;
   a second multiplier having a first input coupled to an output of the phase shift circuit and a second input coupled to the output of the oscillator; and
   a summing circuit having a first input coupled to an output of the first multiplier, a second input coupled to an output of the second multiplier and an output.

2. The demodulator circuit of claim 1, wherein the phase shift circuit receives an oscillator signal from the oscillator and generates an output signal that is in quadrature to the oscillator signal.

3. The demodulator circuit of claim 1, wherein a first signal supplied at the first input and a second signal supplied at the second input of the summing circuit have the same amplitudes.

4. The demodulator circuit of claim 1, wherein the oscillator further includes a second input coupled for receiving an automatic frequency control signal.

5. A circuit, comprising:
   an oscillator circuit having a first input for receiving a signal, a second input for receiving a frequency control signal;
   a first multiplier having a first input coupled for receiving the signal and a second input coupled for receiving an oscillator signal from the oscillator; and
   a second multiplier having a first input coupled for receiving the oscillator signal from the oscillator and a second input coupled for receiving a phase shifted oscillator signal that is in quadrature to the oscillator signal.

6. The circuit of claim 5, further comprising a summing circuit having a first input coupled to an output of the first multiplier and a second input coupled to an output of the second multiplier.

7. The circuit of claim 6, further comprising a phase shift circuit having an input coupled for receiving the oscillator signal and an output for supplying the phase shifted oscillator signal that is in quadrature to the oscillator signal.

8. A method for cancelling a second harmonic of an input signal, comprising:
   generating an oscillator signal that is locked to the input signal and a phase shifted oscillator signal;
   multiplying the oscillator signal and the phase shifted oscillator signal to generate a first multiplied signal;
   multiplying the input signal and the oscillator signal to generate a second multiplied signal;
   summing the first multiplied signal and the second multiplied signal to generate an output signal having the second harmonic cancelled.

9. The method of claim 8, further comprising the step of generating the phase shifted oscillator signal that is in quadrature to the oscillator signal.

10. The method of claim 8, wherein the step of multiplying the oscillator signal and the phase shifted oscillator signal further includes generating the first multiplied signal having a frequency that is two times a frequency of the oscillator signal.

11. The method of claim 8, wherein the step of multiplying the input signal and the oscillator signal further includes generating the second multiplied signal having phase information.

12. The method of claim 8, wherein the step of generating an oscillator signal that is locked to the input signal further includes using an Automatic Frequency Control (AFC) signal for tuning the oscillator signal to the input signal.

* * * * *